(12) United States Patent
Ito

(10) Patent No.: US 10,390,424 B2
(45) Date of Patent: Aug. 20, 2019

(54) HIGH-FREQUENCY MODULE

(71) Applicant: Murata Manufacturing Co., Ltd., Nagaokakyo-shi, Kyoto-fu (JP)

(72) Inventor: Takanori Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/624,917

(22) Filed: Jun. 16, 2017

(65) Prior Publication Data
US 2017/0290143 A1 Oct. 5, 2017

Related U.S. Application Data

(63) Continuation of application No. PCT/JP2016/051781, filed on Jan. 22, 2016.

(30) Foreign Application Priority Data

Jan. 27, 2015 (JP) .................................. 2015-013191

(51) Int. Cl.
*H05K 1/18* (2006.01)
*H05K 1/02* (2006.01)
(Continued)

(52) U.S. Cl.
CPC ....... *H05K 1/0243* (2013.01); *H01L 23/5383* (2013.01); *H01L 23/5384* (2013.01);
(Continued)

(58) Field of Classification Search
CPC ....... H01L 2224/16225; H01L 23/5383; H01L 23/5384; H01L 2924/19105; H03H 1/00;
(Continued)

(56) References Cited

U.S. PATENT DOCUMENTS 6,456,172 B1 * 9/2002 Ishizaki .................. H01L 23/66
333/133
6,713,417 B2 * 3/2004 Chikagawa ............. B32B 18/00
174/258
(Continued)

FOREIGN PATENT DOCUMENTS

| JP | 2002-029827 A | 1/2002 |
|---|---|---|
| JP | 2009-130085 A | 6/2009 |
| JP | 2011-187779 A | 9/2011 |

OTHER PUBLICATIONS

Official Communication issued in International Patent Application No. PCT/JP2016/051781, dated Apr. 5, 2016.

*Primary Examiner* — Yuriy Semenenko
(74) *Attorney, Agent, or Firm* — Keating & Bennett, LLP

(57) ABSTRACT

A high-frequency module includes a multilayer substrate that includes an insulator layer and a wiring electrode, a component on one main surface of the multilayer substrate, a resin layer on the one main surface so as to cover the component, and a shield electrode covering at least a portion of a surface of the resin layer and at least a portion of a side surface of the multilayer substrate. The wiring electrode includes a capacitor via electrode that is spaced away from the shield electrode inside the multilayer substrate, and a first capacitor is defined by the shield electrode and the capacitor via electrode.

16 Claims, 6 Drawing Sheets

(51) Int. Cl.
*H03H 1/00* (2006.01)
*H03H 7/01* (2006.01)
*H05K 1/11* (2006.01)
*H01L 23/538* (2006.01)
*H05K 1/16* (2006.01)
*H05K 3/42* (2006.01)
*H05K 3/46* (2006.01)

(52) U.S. Cl.
CPC ............ *H03H 1/00* (2013.01); *H03H 7/0115* (2013.01); *H05K 1/115* (2013.01); *H05K 1/162* (2013.01); *H05K 1/165* (2013.01); *H05K 1/185* (2013.01); *H05K 3/429* (2013.01); *H05K 3/4629* (2013.01); *H01L 2224/16225* (2013.01); *H01L 2924/19105* (2013.01); *H03H 2001/0021* (2013.01); *H03H 2001/0085* (2013.01); *H05K 2201/0715* (2013.01); *H05K 2201/1003* (2013.01); *H05K 2201/10015* (2013.01)

(58) Field of Classification Search
CPC ... H03H 2001/0021; H03H 2001/0085; H03H 7/0115; H05K 1/0243; H05K 1/115; H05K 1/162; H05K 1/165; H05K 1/185
See application file for complete search history.

(56) References Cited

U.S. PATENT DOCUMENTS

| | | | |
|---|---|---|---|
| 6,879,488 B2* | 4/2005 | Takeda | H01L 23/345 174/252 |
| 7,289,008 B2* | 10/2007 | Kuroki | H03H 9/725 333/133 |
| 9,161,433 B2* | 10/2015 | Yoshida | H05K 1/0209 |
| 2002/0027018 A1 | 3/2002 | Chikagawa et al. | |
| 2003/0169575 A1* | 9/2003 | Ikuta | H01L 23/3677 361/761 |
| 2006/0057793 A1* | 3/2006 | Hatori | H01L 21/823425 438/197 |
| 2006/0081977 A1* | 4/2006 | Sakai | H01L 23/5385 257/703 |
| 2009/0243756 A1* | 10/2009 | Stevenson | A61N 1/3754 333/172 |
| 2010/0230147 A1* | 9/2010 | Gokan | H05K 1/144 174/258 |
| 2013/0154769 A1* | 6/2013 | Masuda | H01P 7/08 333/185 |
| 2014/0378182 A1* | 12/2014 | Hara | H05K 1/0216 455/553.1 |
| 2015/0054599 A1* | 2/2015 | Kitajima | H01P 1/20345 333/185 |
| 2018/0092257 A1* | 3/2018 | Otsubo | H01L 23/00 |

\* cited by examiner

HIGH-FREQUENCY MODULE

CROSS REFERENCE TO RELATED APPLICATIONS

This application claims the benefit of priority to Japanese Patent Application No. 2015-013191 filed on Jan. 27, 2015 and is a Continuation Application of PCT Application No. PCT/JP2016/051781 filed on Jan. 22, 2016. The entire contents of each application are hereby incorporated herein by reference.

BACKGROUND OF THE INVENTION

1. Field of the Invention

The present invention relates to a high-frequency module that includes a high-frequency circuit.

2. Description of the Related Art

To date, a high-frequency module 500 has been proposed in which various components 502 are mounted on one main surface 501a of a multilayer substrate 501 formed of a ceramic or resin and a shield electrode 504 is formed on a resin layer 503 that covers the components 502, as illustrated in FIG. 7 (refer to Japanese Unexamined Patent Application Publication No. 2011-187779 for example). The components 502 are connected to land electrodes 505 formed on the one main surface 501a of the multilayer substrate 501 using a bonding material, such as solder, and are electrically connected to external connection terminals 509 formed on another main surface 501b of the multilayer substrate 501 through via electrodes 506 and in-plane electrodes 507 and 508 formed inside the multilayer substrate 501. Furthermore, the shield electrode 504 is formed so as to cover a surface of the resin layer 503 and a side surface 501c of the multilayer substrate 501 and is connected, at the side surface 501c of the multilayer substrate 501, to an in-plane electrode 508, which is for connection to ground, which is exposed at the side surface 501c.

Generally, circuit elements, such as capacitors and inductors, which form a portion of the high-frequency circuit of the high-frequency module 500, are formed by using the via electrodes 506 and the in-plane electrodes 507 and 508 inside the multilayer substrate 501 in combination with each other. Specifically, for example, a capacitor is formed inside the multilayer substrate 501 by disposing the in-plane electrodes 507 and 508 parallel to each other at a prescribed distance from each other in the stacking direction. Therefore, it is necessary to provide a space in which to arrange the in-plane electrodes 507 and 508, which have a prescribed area, in order to form a capacitor inside the multilayer substrate 501, and consequently, the size of the multilayer substrate 501 in plan view is increased and this prevents reducing the size of the high-frequency module 500.

In addition, when, among the via electrodes 506, a via electrode 506 that is not connected to ground and is for transmitting a high-frequency signal is arranged close to the shield electrode 504, there is a risk of an unwanted parasitic capacitance being generated between that via electrode 506 and the shield electrode 504. In such a case, since the shield electrode 504 is grounded by being connected to a ground-connection in-plane electrode 508 inside the multilayer substrate 501, there is a risk of the characteristics of the high-frequency module 500 being degraded as a result of an unwanted ground capacitance being formed by that via electrode 506, the high-frequency signal leaking via the unwanted capacitance and noise entering from outside the module. Therefore, there is a problem in that the degree of freedom with which the via electrodes 506 may be designed inside the multilayer substrate 501 is restricted.

SUMMARY OF THE INVENTION

Preferred embodiments of the present invention provide a technology that is able to decrease the size of a high-frequency module and improve the degree of freedom with which wiring electrodes inside a multilayer substrate may be designed.

A module according to a preferred embodiment of the present invention includes a multilayer substrate that includes an insulator layer and a wiring electrode; a component that is mounted on one main surface of the multilayer substrate; a resin layer that is provided on the one main surface so as to cover the component; and a shield electrode that covers at least a portion of a surface of the resin layer and at least a portion of a side surface of the multilayer substrate; wherein the wiring electrode includes a capacitor via electrode that is arranged at a desired spacing from the shield electrode inside the multilayer substrate, and a first capacitor is defined by the shield electrode and the capacitor via electrode.

With this configuration, the first capacitor, which defines a portion of a prescribed high-frequency circuit, is defined by the shield electrode, which is provided on at least a portion of the side surface of the multilayer substrate, and a first capacitor via electrode, and therefore, the size of the first capacitor, when viewed in plan view from the one main surface of the multilayer substrate, is able to be reduced as compared to a configuration in which a capacitor is defined by in-plane electrodes in combination with each other inside a multilayer substrate and, therefore, the high-frequency module is able to be reduced in size. In addition, the first capacitor is provided by arranging the first capacitor via electrode, which is not connected to ground and is provided to transmit a high-frequency signal, close to the shield electrode and, as a result, it is possible to improve the degree of freedom with which wiring electrodes inside the multilayer substrate is able to be easily designed.

In addition, a plurality of the capacitor via electrodes may preferably be provided, and the wiring electrode may include a first capacitor in-plane electrode that electrically connects the capacitor via electrodes to each other.

With this configuration, the area of a portion where the shield electrode and each first capacitor via electrode, which define a first capacitor, oppose each other is able to be increased and, therefore, the capacitance value of the first capacitor is able to be increased.

In addition, the wiring electrode may preferably include a plurality of second capacitor in-plane electrodes, and the capacitor via electrode and the second capacitor in-plane electrodes may be electrically connected to each other inside the multilayer substrate.

With this configuration, the size of the second capacitor in-plane electrodes when viewed in plan from the one main surface of the multilayer substrate is able to be reduced as compared to the case where a capacitor is defined by only in-plane electrodes, and therefore, the high-frequency module is able to be reduced in size.

In addition, the capacitor via electrode may include interlayer-connection via conductors, which are provided in a plurality of the insulator layers, that are connected to each other in a stacking direction.

With this configuration, a capacitance-generating region of the first capacitor in the stacking direction is able to be increased and, therefore, the capacitance value of the first capacitor is able to be increased without increasing the size of the high-frequency module.

Furthermore, the via conductors may preferably have a circular or substantially circular cross section and a diameter of at least one of the via conductors may be different from a diameter of another of the via conductors. In addition, a central axis that passes through a center of the cross section of at least one of the via conductors may be arranged so as to be shifted from a central axis that passes through a center of the cross section of another of the via conductors that is adjacent thereto in the stacking direction.

With this configuration, the distance between each of the via conductors and the shield electrode is able to be adjusted and, therefore, the capacitance value of the first capacitor is able to be easily adjusted.

It is preferable that another wiring line is not arranged in plan view between the capacitor via electrode and the shield electrode, which define the first capacitor.

With this configuration, the high-frequency module is able to be reduced in size. In addition, the accuracy with which the wiring electrodes inside the multilayer substrate are designed is able to be improved.

A distance between the capacitor via electrode and the shield electrode, which define the first capacitor, may preferably be smaller than a distance between the component and the shield electrode.

With this configuration, space is opened up beneath the component and, therefore, the freedom of design is improved.

According to various preferred embodiments of the present invention, the first capacitor, which defines a portion of a high-frequency circuit, is defined by the shield electrode, which is provided on at least a portion of the side surface of the multilayer substrate, and the first capacitor via electrode and, therefore, the size of the first capacitor, when viewed in plan view from the one main surface of the multilayer substrate, is able to be reduced and the high-frequency module is able to be reduced in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
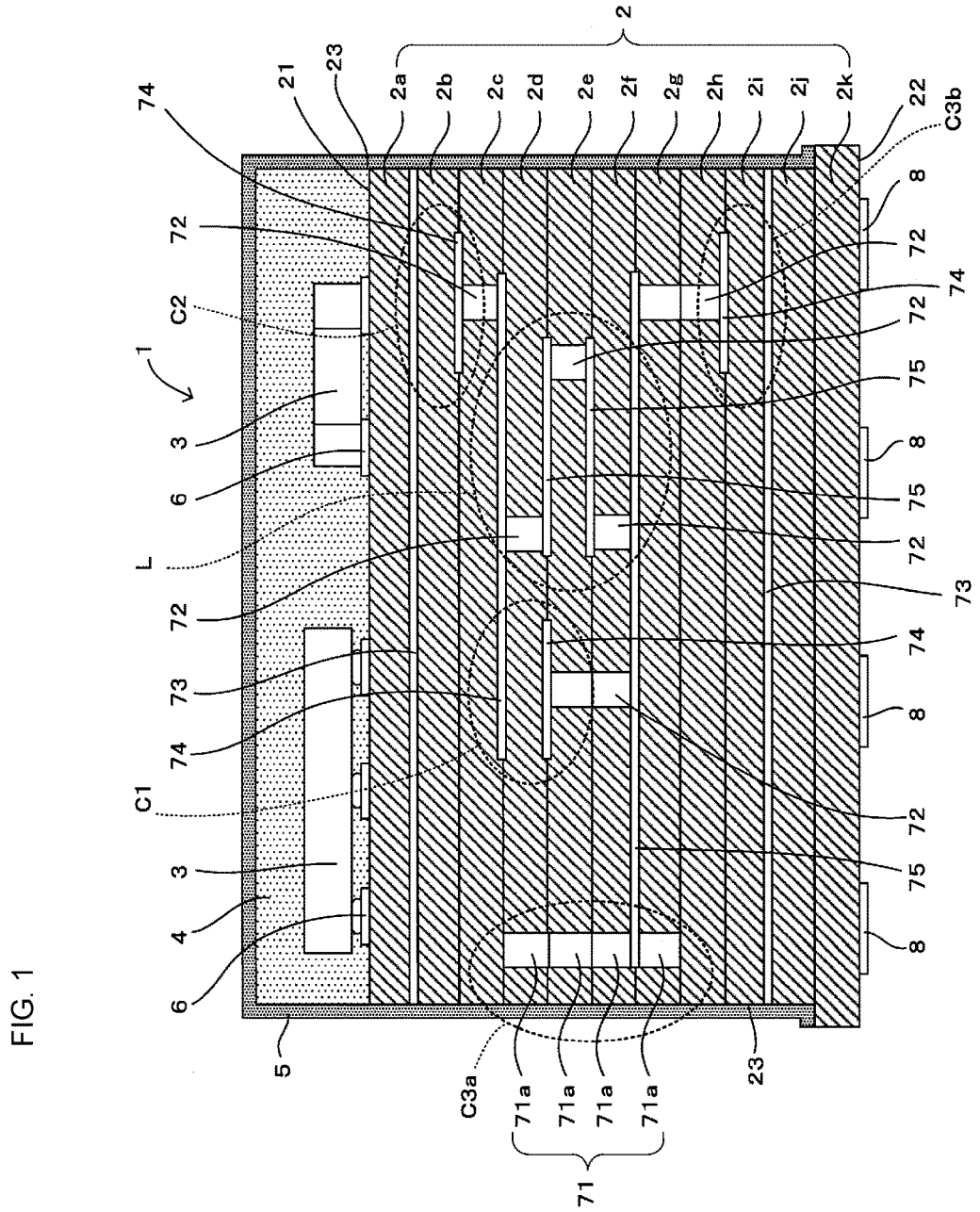
FIG. 1 is a sectional view of a high-frequency module according to a first preferred embodiment of the present invention.

A first preferred embodiment of a high-frequency module according to the present invention will be described with reference to FIGS. 1 and 2. In FIG. 1, only portions of the configuration related to a preferred embodiment of the present invention are illustrated and illustration of other portions of the configuration is omitted in order to simplify the description. Furthermore, in FIGS. 3 to 5 as well, which are referred to in a subsequent description, only portions of the configuration are illustrated as in FIG. 1 and description thereof is omitted in the subsequent description.

A high-frequency module 1 illustrated in FIG. 1 includes a high-frequency circuit and is mounted on a mother substrate of a mobile communication terminal, such as a cellular phone or a mobile information terminal, for example. In this preferred embodiment, the high-frequency module 1 includes a multilayer substrate 2, various components 3, such as switch ICs, filters, resistors, capacitors and inductors, for example, that define the high-frequency circuit, a resin layer 4 and a shield electrode 5, and defines a high-frequency antenna-switching module.

In addition, the various components 3 are mounted using a bonding material, such as solder, for example, on land electrodes 6 provided on one main surface 21 of the multilayer substrate 2. The various components 3 and a plurality of external connection terminals 8, which are provided on another main surface 22 of the multilayer substrate 2, are electrically connected to each other through via electrodes 71 and 72 and in-plane electrodes 73 to 75 provided in the multilayer substrate 2.

The resin layer 4 is provided on the one main surface 21 of the multilayer substrate 2 so as to cover the various components 3 using a typical thermally curable molding resin, such as epoxy resin, for example. In addition, the shield electrode 5 is provided so as to cover a surface of the resin layer 4 and at least a portion of a side surface 23 of the multilayer substrate 2 by sputtering or vapor depositing a metal material, such as Au, Ag, Al or Cu, for example, or by applying a conductive paste containing a metal material, such as Au, Ag, Al or Cu, for example.

In this preferred embodiment, the multilayer substrate 2 includes a plurality (for example, eleven in this preferred embodiment) of ceramic green sheets, which are obtained preferably by forming a slurry made by mixing a mixed powder composed of, for example, alumina and glass together with, for example, an organic binder and a solvent into sheet shapes using a mold. The via electrodes 71 and 72 are preferably formed by forming via holes, using laser processing, for example, in the ceramic green sheets, which have been cut into desired shapes, and filling the formed via holes with a conductive paste containing various metal materials or performing via fill plating, for example. In addition, the various in-plane electrodes 73 to 75, the land electrodes 6, and the external connection terminals 8 are formed, for example, by applying a conductive paste onto main surfaces of the ceramic green sheets. The ceramic green sheets on which the electrodes and external connection terminals are formed are, for example, stacked in a plurality of layers and are fired at a low temperature of around 1000° C. at the same time together with the electrodes and the external connection terminals, such that the multilayer substrate 2 is formed. Once the ceramic green sheets have been fired, insulator layers 2a to 2k are formed and a ground-connection second-capacitor in-plane electrode 73, among the in-plane electrodes 73 to 75, is exposed at the side surface 23 of the multilayer substrate 2 and electrically connected to the shield electrode 5.

Furthermore, an LC filter 9 (low pass filter), which is a high-frequency circuit of the high-frequency module 1, is provided inside the multilayer substrate 2 using, in combination with each other, an inductor and capacitors that include the via electrodes 71 and 72 and the in-plane electrodes 73 to 75. As illustrated in FIG. 2, the LC filter 9 includes a parallel resonance circuit that is defined by an inductor L and a second capacitor C1 and is serially connected between an input terminal In and an output terminal Out, a second capacitor C2 that includes one end thereof connected to an output-terminal-Out side of the resonance circuit and another end thereof connected to ground, and a capacitor C3 that includes one end connected to an input-terminal-in terminal-In side of the resonance circuit and another end thereof connected to ground.

As illustrated in FIG. 1, the inductor L is defined by connecting the via electrodes 72 and the in-plane electrodes 75, which are provided in and on the insulator layers 2d to 2f, to each other in a spiral shape in the stacking direction. Furthermore, the second capacitor C1 is defined by arranging the second-capacitor in-plane electrodes 74, which are provided on the insulator layers 2d and 2e, so as to face each other with a desired spacing therebetween in the stacking direction. Furthermore, the second capacitor C2 is defined by arranging the second-capacitor in-plane electrodes 73 and 74, which are provided on the insulator layers 2b and 2c, so as to face each other with a desired spacing therebetween in the stacking direction.

As illustrated in FIG. 1, the capacitor C3 is defined by electrically connecting a first capacitor C3a and a second capacitor C3b to each other inside the multilayer substrate 2. The first capacitor C3a includes the capacitor via electrode 71, which is arranged at a desired spacing from the shield electrode 5 provided on the side surface of the multilayer substrate 2, and the shield electrode 5. The capacitor via electrode 71 is defined by connecting, in the stacking direction, interlayer-connection via conductors 71a provided in a plurality (for example, four) of insulator layers 2d to 2g of the multilayer substrate 2. In addition, the second capacitor C3b is defined preferably by arranging the second-capacitor in-plane electrodes 73 and 74, which are provided on the insulator layers 2i and 2j, so as to face each other with a desired spacing therebetween in the stacking direction.

The shield electrode 5, which defines a portion of the first capacitor C3a, and the second capacitor in-plane electrode 73, which defines a portion of the second capacitor C3b, are electrically connected to each other at the side surface 23 of the multilayer substrate 2. The capacitor via electrode 71, which defines a portion of the first capacitor C3a, and the second-capacitor in-plane electrode 74 are electrically connected to each other through the via electrode 72 and the in-plane electrode 75. With the above-described configuration, the capacitor C3 is able to be defined by connecting the first capacitor C3a and the second capacitor C3b in parallel with each other.

Thus, by defining the capacitor C3 preferably by connecting the first capacitor C3a and the second capacitor C3b in parallel with each other inside the multilayer substrate 2, the areas of the second-capacitor in-plane electrodes 73 and 74 are able to be reduced as compared to a capacitor defined by only the second-capacitor in-plane electrodes 73 and 74. Thus, the high-frequency module 1 is able to be reduced in size.

Furthermore, a capacitance-generating region of the first capacitor C3a in the stacking direction is able to be increased by the capacitor via electrode 71 defined by connecting a plurality of via conductors 71a and, therefore, the capacitance value of the first capacitor C3a is able to be increased without increasing the size of the high-frequency module 1. In addition, as illustrated in FIGS. 1 and 2, the in-plane electrodes 75, which defines a portion of the inductor L, and the capacitor via electrode 71, which defines a portion of the first capacitor C3a, are electrically connected to each other and, therefore, the capacitor via electrode 71 is able to be used as a portion of the inductor L of the LC filter 9. Thus, the inductor L is able to be reduced in size and the high-frequency module 1 is able to be reduced in size.

Furthermore, the first capacitor C3a is defined by arranging the capacitor via electrode 71, which is not connected to ground and is used to transmit a high-frequency signal, close to the shield electrode 5, and as a result, the capacitor via electrode 71 is able to be arranged closer to the shield electrode 5 and, therefore, the freedom with which the wiring electrodes is able to be designed inside the multilayer substrate 2 is improved as compared to a configuration of the related art. In addition, since the first capacitor C3a is able to be defined by arranging the capacitor via electrode 71 in a region where the large-area in-plane electrodes 73 and 74 cannot be arranged, a first capacitor C3a having a larger capacitance value is able to be provided inside the multilayer substrate 2 while maintaining the size of the high-frequency module 1.

Furthermore, since only the electrodes 72 to 75, which are included in the LC filter 9, are connected to the capacitor via electrode 71, the effect of noise from outside the module is able to be reduced.

The pattern shape of the inductor L is not limited to a spiral shape provided inside the multilayer substrate 2 in the stacking direction as described above and may have any shape, such as a helical, or swirl shape, a meandering shape or a line shape, for example. Furthermore, other circuit elements, such as inductors and capacitors, may be additionally defined by the via electrodes 71 and 72 and the in-plane electrodes 73 to 75 provided in and on the insulator layers 2a to 2k. Furthermore, various circuits, such as a filter circuit and a matching network, may be additionally defined by using such circuit elements in combination with each other.

In addition, the multilayer substrate 2 may preferably be a multilayer substrate, such as a printed substrate, an LTCC, an alumina-based substrate or a composite material substrate using, for example, a resin, a ceramic or a polymer material and the multilayer substrate 2 preferably is formed by selecting the most suitable material in accordance with the intended use of the high-frequency module 1. Thus, a "wiring electrode" preferably is defined by the land electrodes 6, the via electrodes 71 and 72, the in-plane electrodes 73 to 75, and the external connection terminals 8, for example.

Second Preferred Embodiment

Figure 3:
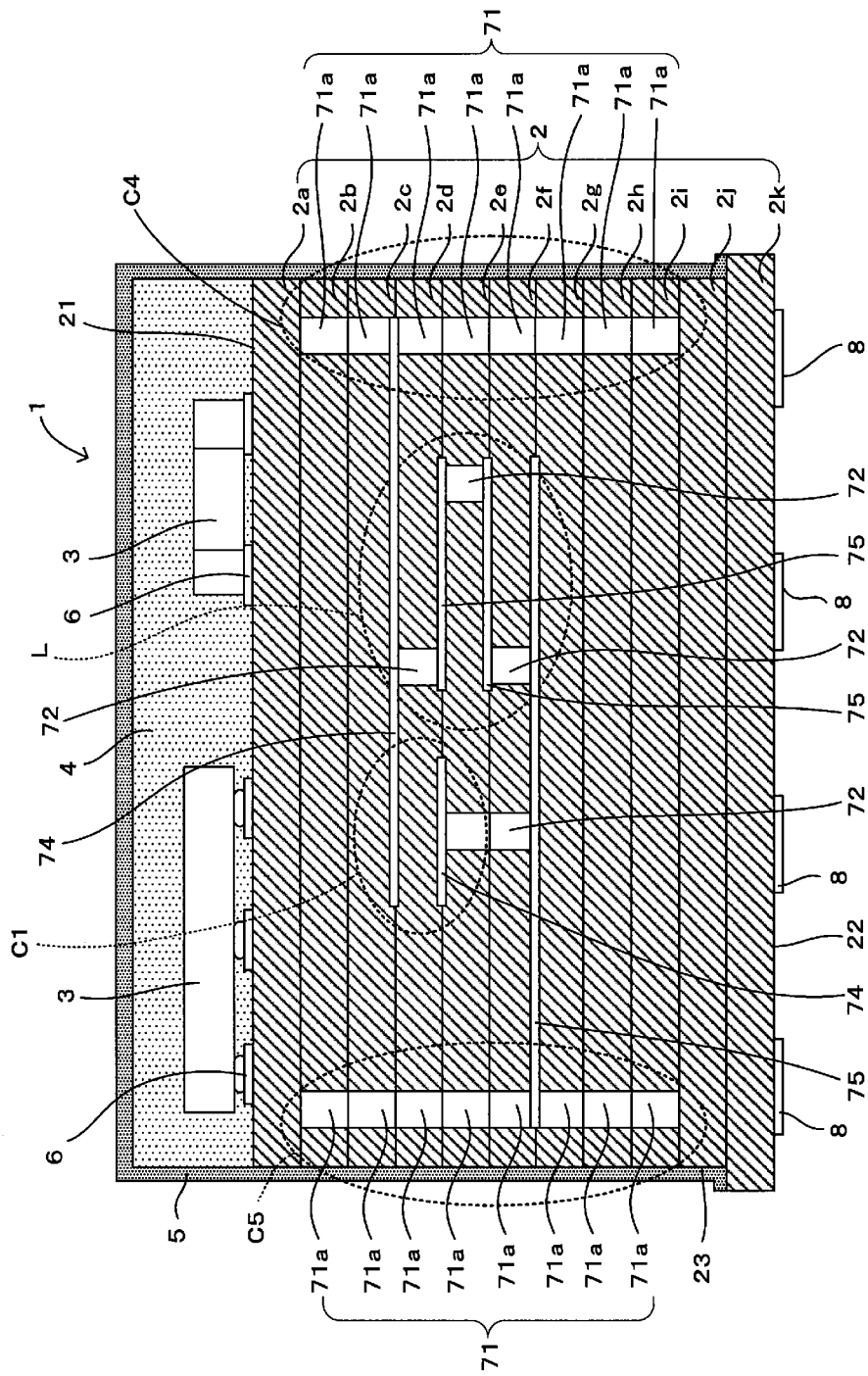
FIG. 3 is a sectional view of a high-frequency module according to a second preferred embodiment of the present invention.

Next, a second preferred embodiment of the present invention will be described while referring to FIG. 3.

Figure 2:
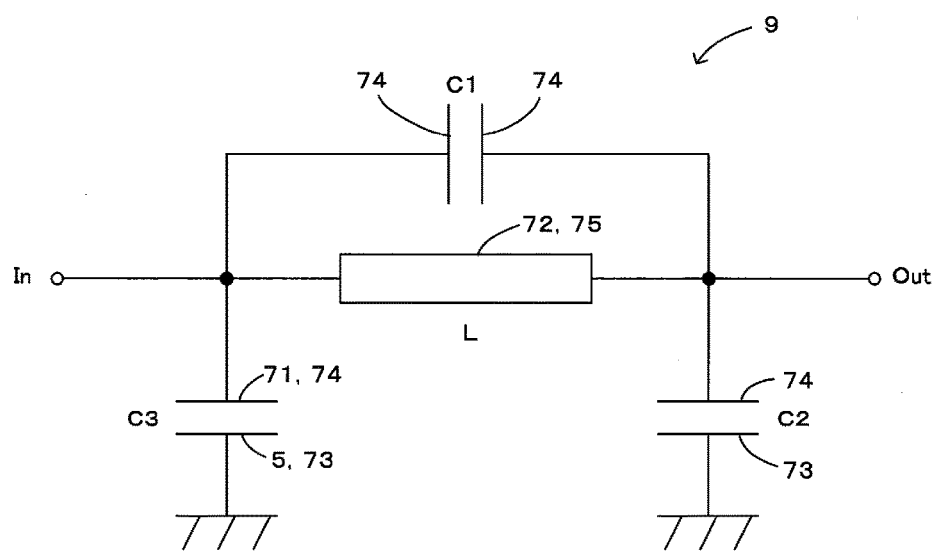
FIG. 2 is a circuit diagram illustrating an LC filter included in the high-frequency module of FIG. 1.

This preferred embodiment differs from the first preferred embodiment described above in that the second capacitor C2 of the LC filter 9 of FIG. 2 is defined by a first capacitor C4 and the capacitor C3 is defined by a first capacitor C5. The rest of the configuration is the same or substantially the same as in the first preferred embodiment described above and, therefore, the same symbols are used and description thereof is omitted.

The first capacitors C4 and C5 are defined by capacitor via electrodes 71, which are arranged at a desired spacing from the shield electrode 5 provided on the side surfaces of the multilayer substrate 2, and the shield electrode 5. The capacitor via electrodes 71 are each defined by connecting, in the stacking direction, interlayer-connection via conductors 71a provided in a plurality (for example, eight) of insulator layers 2d to 2g of the multilayer substrate 2.

Thus, a portion of the LC filter 9 is defined by the first capacitors C4 and C5, which use via electrodes as capacitor electrodes, and as a result, the planar size of the LC filter 9 is further reduced and, consequently, the high-frequency module 1 is able to be further reduced in size. In addition, when an inductor and capacitor are arranged inside the multilayer substrate 2, spreading of the magnetic field generated by the inductor is inhibited by capacitor electrodes arranged nearby and there is a problem in that the Q value of the inductor is reduced. However, a configuration is able to be utilized in which the planar second-capacitor in-plane electrodes 73 are not arranged above and below the inductor L by omitting or reducing the areas of the planar second-capacitor in-plane electrodes 73, as in this preferred embodiment, and therefore, a reduction of the Q value of the inductor L is able to be decreased or prevented, and a pass loss of the LC filter 9 is able to be improved.

Third Preferred Embodiment

Figure 4:
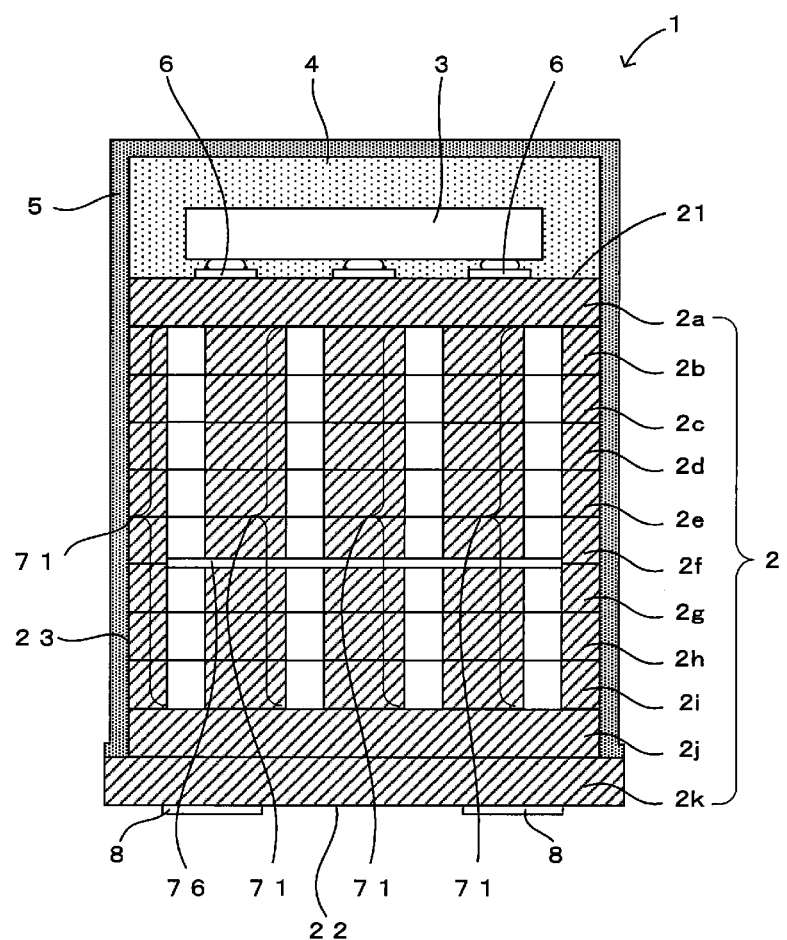
FIG. 4 is a left-side sectional view of a high-frequency module according to a third preferred embodiment of the present invention.

Next, a third preferred embodiment of the present invention will be described while referring to FIG. 4.

This preferred embodiment differs from the second preferred embodiment described above in that a plurality (for example, four) of the capacitor via electrodes 71 are provided inside the multilayer substrate 2 and the capacitors C4 and C5 are defined by the shield electrode 5 and the plurality of capacitor via electrodes 71. The capacitor via electrodes 71 are arranged parallel or substantially parallel to the side surface (shield electrode 5) of the multilayer substrate 2 and the capacitor via electrodes 71 are electrically connected to each other inside the multilayer substrate 2 by a first capacitor in-plane electrode 76 (wiring electrode) provided on the insulator layer 2g. The rest of the configuration preferably is the same or substantially the same as in the first and second preferred embodiments described above and, therefore, the same symbols are used and description thereof is omitted. In addition, the capacitor via electrodes that define the capacitor C4 and the capacitor C5 are not electrically connected to each other.

Thus, by electrically connecting a plurality of capacitor via electrodes 71 to each other using the first capacitor in-plane electrode 76, the area of the portion where the shield electrode 5 and each capacitor via electrode 71 oppose each other is able to be increased and, therefore, the capacitance values of the first capacitors C4 and C5 are able to be increased. Consequently, since the second capacitor in-plane electrode provided inside the multilayer substrate 2 is able to be omitted or made smaller, the high-frequency module is able to be further reduced in size.

The plurality of capacitor via electrodes 71 may be electrically connected to each other via a plurality of first capacitor in-plane electrodes 76 provided on different insulator layers. By adjusting the number of first capacitor in-plane electrodes 76 in this way, the size of the areas of the electrodes that oppose the shield electrode 5 defining the first capacitors C4 and C5 is able to be adjusted and, therefore, the capacitance values of the first capacitors C4 and C5 are able to be easily adjusted.

Fourth Preferred Embodiment

Figure 5:
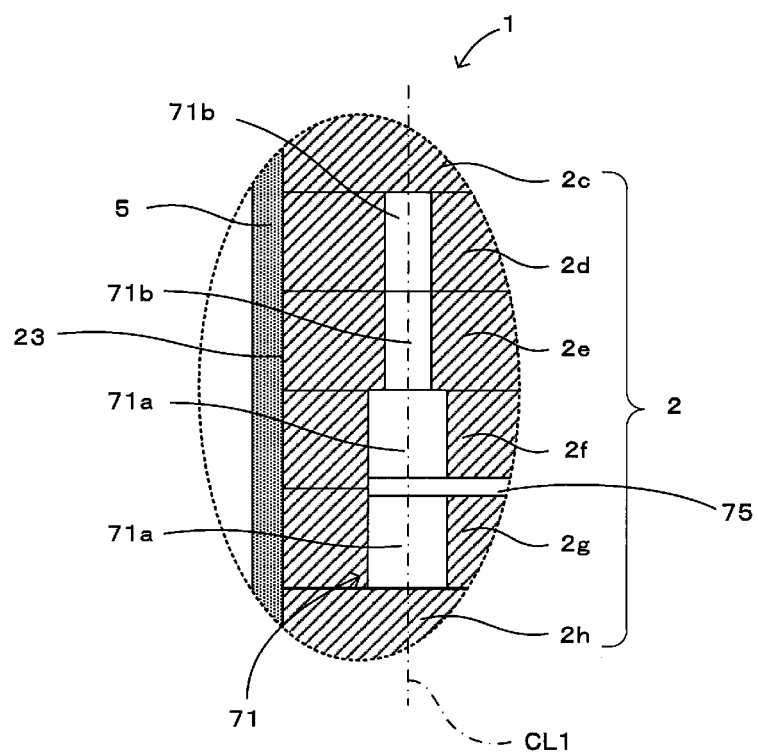
FIG. 5 is an enlarged view of a portion of a high-frequency module according to a fourth preferred embodiment of the present invention.

Next, a fourth preferred embodiment of the present invention will be described while referring to FIG. 5.

This preferred embodiment differs from the first preferred embodiment described above in that, as illustrated in FIG. 5, the fourth preferred embodiment is structured such that the diameter of at least one via conductor 71b, among via conductors 71a and 71b that define the capacitor via electrode 71 and have a circular or substantially circular cross section, is different from the diameter of the other via conductors 71a. The rest of the configuration is the same or substantially the same as in the first preferred embodiment described above and, therefore, the same symbols are used and description thereof is omitted.

Figure 6:
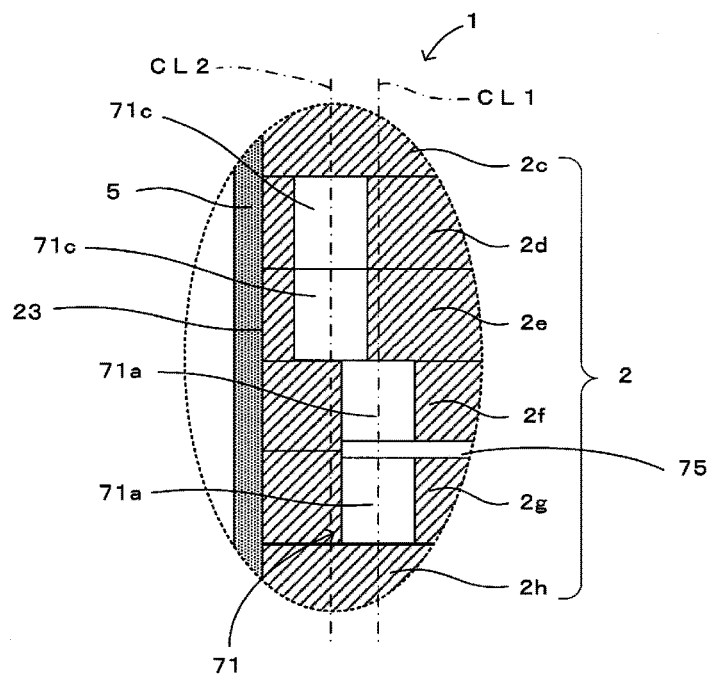
FIG. 6 is an enlarged view of a portion illustrating a modification of FIG. 5.
Figure 7:
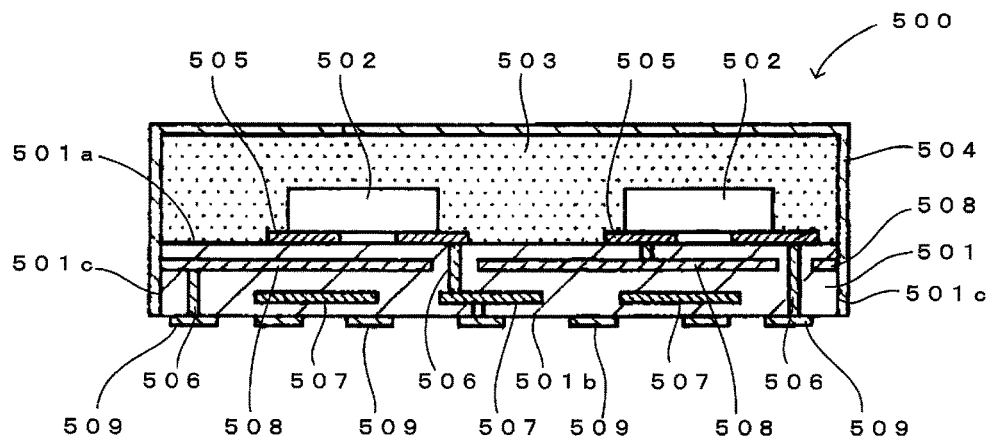
FIG. 7 is a sectional view illustrating a high-frequency module of the related art.

With this configuration, the distance between the via conductor 71b and the shield electrode 5 is able to be adjusted and, therefore, the capacitance value of the first capacitor C3a is able to be easily adjusted. In FIG. 5, a central axis CL1 that passes through the centers of cross sections of via conductors 75a and 75b is arranged as a straight line. However, as illustrated in FIG. 6, for example, a central axis CL2 that passes through the center of the cross section of a via conductor 71c may preferably be arranged so as to be shifted from a central axis CL1 that passes through the center of the cross section of another via conductor 71a arranged adjacent thereto in the stacking direction and the via conductor 71c may preferably be arranged closer to the shield electrode 5. With this configuration, the adjustment range of the capacitance value is able to be increased. Furthermore, in this case, the diameters of the cross sections of the via conductors 71a and 71c, which are arranged such that the central axes CL1 and CL2 thereof are shifted from each other, may be the same as each other or may be different from each other.

The present invention is not limited to the above-described preferred embodiments and may be modified in various ways not described above as long as they do not depart from the gist of the present invention. For example, a configuration may be utilized in which no other wiring lines are arranged in plan view between the capacitor via electrode 71 and the shield electrode 5, which define a first capacitor. With this configuration, the size of the high-frequency module is able to be reduced and the design accuracy of the wiring electrodes inside the multilayer substrate is able be improved.

In addition, the distance between the capacitor via electrode 71 and the shield electrode 5, which define a first capacitor, may be made smaller than the distance between the components 3 and the shield electrode 5. In this case, space is opened up beneath the components and, therefore, the freedom of design is improved.

Furthermore, the configurations of the above-described preferred embodiments may be combined in any manner, the number of via conductors 71a used to define a capacitor via electrode 71 is not limited to the examples described above, and the capacitance value is to be adjusted by connecting one to a plurality of via conductors 71a, as appropriate, in accordance with the required capacitance value. In addition, the number of capacitor via electrodes 71 that are arranged in parallel or substantially in parallel and electrically connected to each other with a first capacitor in-plane electrode 76 is also not limited to the example illustrated in FIG. 4 and the capacitance value is to be adjusted by connecting one to a plurality of capacitor via electrodes 71, as appropriate, in accordance with the required capacitance value.

Furthermore, the entire surface of the resin layer 4 need not be covered by the shield electrode 5, and, for example, the shield electrode 5 may be structured such that a portion of the surface of the resin layer 4 is not covered thereby and, for example, a mark may be provided on the exposed portion of the surface of the resin layer 4. In addition, the entire side surface 23 of the multilayer substrate 2 may be covered by the shield electrode 5.

In addition, in the above-described preferred embodiments, a portion of the LC filter 9 is defined by the first capacitors C3a, C4 and C5. However, another high-frequency circuit, such as a matching network, may include the first capacitors C3a, C4 and C5.

Preferred embodiments of the present invention are able to be broadly applied to high-frequency modules that include a high-frequency circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a multilayer substrate that includes an insulator layer and a wiring electrode;
a component that is mounted on one main surface of the multilayer substrate;
a resin layer that is provided on the one main surface to cover the component; and
a shield electrode that is provided to cover at least a portion of a surface of the resin layer and at least a portion of a side surface of the multilayer substrate; wherein
the wiring electrode includes a via electrode that is spaced away from the shield electrode inside the multilayer substrate; and
a first capacitor is defined by the shield electrode and the via electrode.

2. The high-frequency module according to claim 1, wherein a plurality of the via electrodes is provided, and the wiring electrode includes a first in-plane electrode that electrically connects the plurality of via electrodes to each other.

3. The high-frequency module according to claim 1, wherein the wiring electrode includes a plurality of second in-plane electrodes, and the via electrode and the second in-plane electrodes are electrically connected to each other inside the multilayer substrate.

4. The high-frequency module according to claim 1, wherein the via electrode is defined by interlayer-connection via conductors which are provided in a plurality of the insulator layers and connected to each other in a stacking direction.

5. The high-frequency module according to claim 4, wherein the interlayer-connection via conductors have a circular or substantially circular cross section and a diameter of at least one of the interlayer-connection via conductors is different from a diameter of another one of the interlayer-connection via conductors.

6. The high-frequency module according to claim 4, wherein a central axis that passes through a center of the cross section of at least one of the interlayer-connection via conductors is shifted from a central axis that passes through a center of the cross section of another one of the interlayer-connection via conductors that is adjacent thereto in the stacking direction.

7. The high-frequency module according to claim 4, wherein no other wiring line is arranged in plan view between the via electrode and the shield electrode, which define the first capacitor.

8. The high-frequency module according to claim 4, wherein a distance between the via electrode and the shield electrode, which define the first capacitor, is smaller than a distance between the component and the shield electrode.

9. The high-frequency module according to claim 1, wherein the component includes at least one of a switch IC, a filter, a resistor, a capacitor, and an inductor that defines a high-frequency circuit.

10. The high-frequency module according to claim 1, wherein the resin layer is made of a thermally-cured molding resin.

11. The high-frequency module according to claim 1, wherein the shield electrode includes at least one of Au, Ag, Al and Cu.

12. The high-frequency module according to claim 1, further comprising an LC filter provided inside the multilayer substrate, the LC filter including a second capacitor and an inductor.

13. The high-frequency module according to claim 12, wherein the second capacitor and the inductor define a parallel resonance circuit.

14. The high-frequency module according to claim 13, wherein the parallel resonance circuit is serially connected between an input terminal and an output terminal of the high-frequency module.

15. The high-frequency module according to claim 14, further comprising a third capacitor that includes one end connected to an output-terminal-out side of the resonance circuit and another end connected to ground, and a fourth capacitor that includes one end connected to an input-terminal-in side of the resonance circuit and another end connected to ground.

16. The high-frequency module according to claim 12, wherein the inductor has a spiral shape.

* * * * *